United States Patent [19]

Dhong et al.

[11] Patent Number: 4,954,731
[45] Date of Patent: Sep. 4, 1990

[54] WORDLINE VOLTAGE BOOSTING CIRCUITS FOR COMPLEMENTARY MOSFET DYNAMIC MEMORIES

[75] Inventors: Sang H. Dhong, Mahopac; Wei Hwang, Armonk; Nicky C. Lu, Yorktown Heights, all of N.Y.

[73] Assignee: International Business Machines Corporation, Armonk, N.Y.

[21] Appl. No.: 344,340

[22] Filed: Apr. 26, 1989

[51] Int. Cl.⁵ .............................................. H03K 17/10
[52] U.S. Cl. ...................................... 307/482; 307/452; 307/481; 365/204
[58] Field of Search .................. 307/443, 448, 452–453, 307/481–482, 246, 578, 264; 365/204, 230.6

[56] References Cited

U.S. PATENT DOCUMENTS

| | | | |
|---|---|---|---|
| 3,801,831 | 4/1974 | Dame | 307/251 |
| 3,852,625 | 12/1974 | Kubo | 307/304 |
| 3,943,377 | 3/1976 | Suzuki | 307/451 |
| 3,947,829 | 3/1976 | Suzuki | 340/173.5 |
| 3,982,138 | 9/1976 | Luisi et al. | 307/451 |
| 3,999,081 | 12/1976 | Nakajima | 307/451 |
| 4,000,412 | 12/1976 | Rosenthal et al. | 307/482 |
| 4,029,973 | 6/1977 | Kobayashi et al. | 307/264 |
| 4,045,691 | 8/1977 | Asano | 307/264 |
| 4,061,929 | 12/1977 | Asano | 307/264 |
| 4,129,794 | 12/1978 | Dickson et al. | 307/270 |
| 4,216,390 | 8/1980 | Stewart | 307/264 |
| 4,398,100 | 8/1983 | Tobita et al. | 307/264 |
| 4,520,463 | 5/1985 | Okumura | 365/189 |
| 4,542,310 | 9/1985 | Ellis et al. | 307/452 X |
| 4,574,203 | 3/1986 | Baba | 307/269 |
| 4,578,601 | 3/1986 | McAlister et al. | 307/452 X |
| 4,639,622 | 1/1987 | Goodwin et al. | 307/482 |
| 4,689,495 | 8/1987 | Liu | 307/482 X |
| 4,689,505 | 8/1987 | Ghoshal | 307/482 X |
| 4,692,638 | 9/1987 | Stiegler | 307/452 X |
| 4,697,106 | 9/1987 | Watanabe | 307/452 X |
| 4,707,625 | 11/1987 | Yanagisawa | 307/578 |
| 4,823,024 | 4/1989 | Sanwo et al. | 307/482 X |

Primary Examiner—David Hudspeth
Attorney, Agent, or Firm—John J. Goodwin

[57] ABSTRACT

Two embodiments of a wordline boost clock circuit that can be used in high speed DRAM circuits are disclosed. The clock circuits require only one boost capacitor and discharge the wordlines faster, improving the DRAM access time. The basic feature of the clock circuit is in the floating gate structure of the nmos device which drives the load to negative during the boosting. In the first embodiment of the clock, the gate of a first device is connected to a first node through a second device. A second node, connected to a wordline, is discharged through the first and a third device when a third node is high with a fourth node low. After a sufficient discharge of the second node, the fourth node is pulled to VDD turning the second device on and a fourth device off. The first (NMOS) transistor has its gate and drain connected together and forms a diode. When a boost capacitor pulls the first node down to negative, the first device stays completely off because of its diode configuration and the second node is pulled to negative through the third device. In the second embodiment, a first device is connected between a boost capacitor and a second node. The load is discharged through a third device with a fourth device on but a first and second device off. After a sufficient discharge of the load, a fourth device is turned off but a second device is turned on, making the third device a diode. When a fifth node is pulled to ground, the second node is pulled down to negative with the first device on. In the second embodiment circuit, the load discharges through only one nmos device and consequently discharges faster than the circuit of the first embodiment.

11 Claims, 10 Drawing Sheets

WORDLINE VOLTAGE BOOSTING CIRCUITS FOR COMPLEMENTARY MOSFET DYNAMIC MEMORIES

BACKGROUND OF THE INVENTION

1. Field of the Invention

The present invention relates to voltage boosting circuits, and more particularly to a boosting circuit for a wordline clock circuit in a semiconductor memory.

2. Description of the Prior Art

Voltage boosting circuits are described in the prior art in various configurations for a variety of purposes.

U.S. Pat. No. 4,061,929, issued Dec. 6, 1977 to Asano entitled CIRCUIT FOR OBTAINING DC VOLTAGE HIGHER THAN POWER SOURCE VOLTAGE describes a voltage boosting circuit which comprises a plurality of units connected in sequence and each composed of a condenser and a plurality of MOSFETs without any transformer or diode.

U.S. Pat. No. 4,029,973 issued June 14, 1977 to Kobayashi et al entitled VOLTAGE BOOSTER CIRCUIT USING LEVEL SHIFTER COMPOSED OF TWO COMPLEMENTARY MIS CIRCUITS discloses an improvement for a voltage booster circuit. The improvement lies in the use of MISFETs as a switching means in a level converting circuit constructed in a complementary MIS semiconductor integrated circuit and therefore the voltage loss due to the conventional switching means can be prevented.

In U.S. Pat. No. 4,216,390 issued Aug. 5, 1980 to Stewart entitled LEVEL SHIFT CIRCUIT, a gating means, biased to pass current only during signal transitions, transfers binary signals from an input signal source to a latch circuit when the signal source and the latch are operated at similar voltages. Following data transfer, the operating voltage across the latch is increased. The voltage levels of the latch output signals are correspondingly increased but the state to which the latch was set is maintained and there is no steady state current conduction through the gating means.

In U.S. Pat. 4,045,691, issued Aug. 30, 1977 to Asano, also entitled LEVEL SHIFT CIRCUIT, a level shift circuit is disclosed including an inverter connected to a first voltage supply source and supplied with an input pulse. A condenser and a directional switching element are connected in series between the output point of the inverter and one potential point of the first voltage supply source. The input of a first MOS-FET is connected to the output of the inverter while the input of a second MOS-FET is connected to a connection point between the condenser and the directional switching element. The source of the first MOS-FET is connected to a common terminal of first and second voltage supply sources while the source of the second MOS-FET is connected to the other terminal of the second voltage supply source. An output voltage is generated between a common connecting point of the drains of the first and second MOS-FETs and one potential point of the second voltage supply source.

Circuits for generating pulsating potentials and voltage levels outside the range of, and/or of greater magnitude than the operating potential applied to the circuits are described in U.S. Pat. No. 4,000,412, issued Dec. 28, 1976 to Rosenthal et al entitled VOLTAGE AMPLITUDE MULTIPLYING CIRCUITS. Each circuit includes first and second transistors for applying a first voltage to one plate of a capacitor and a second voltage to the other plate of the capacitor, during one time interval. During a subsequent time interval, the first and second transistors are turned off and a third transistor applies the second potential to the one plate of the capacitor. The change in the potential at the one plate of the capacitor is coupled to the other plate of the capacitor at which is produced an output potential outside the range of the first and second voltages. The potential difference between the first voltage and the output potential difference is greater in amplitude than the potential difference between the first and second voltages. The circuit may also include means alternately applying the first voltage and then the output potential to an output point for generating pulsating signals of greater amplitude than the magnitude of the applied potential. The outputs of two or more circuits may be combined to produce direct current (d.c.) levels. Also included are circuits which operate from a pulsating source of operating potential.

U.S. Pat. No. 4,520,463, issued May 28, 1985 to Okumura, describes a memory circuit having an improved address decoder which is operable with a low power consumption and comprises a logic means for decoding a part of address signals provided for a plurality of address lines of a memory cell array, and a plurality of transfer gates provided between the logic means and the address lines, in which one of those transfer gates is made enabled in response to a different part of the address signals thereby to transmit the output signal of the logic means to a selected row line through the enabled transfer gate.

In U.S. Pat. No. 4,574,203, issued Mar. 4, 1986 to Baba, a clock generating circuit is described which includes a switch control circuit controlling a C-MOS circuit including first and second transistors having first and second conductivity types, respectively. Also included in the clock generating circuit is a bootstrap capacitor having a first end connected to the junction between the first and second transistors. The switch circuit includes a third transistor, having the first conductivity type, connected between the gate of the first transistor and the junction between the first and second transistors, and a fourth transistor, having the second conductivity type, connected between the gates of the first and second transistors. The gate of the second transistor is connected to receive an input clock signal and the gates of the third and fourth transistors are connected together to receive a delayed clock signal produced by delaying the input clock signal. The second end of the bootstrap capacitor is connected to receive a further delayed and inverted clock signal. When the delayed clock signal has a first value, the switching circuit connects the gates of the first and second transistors together and an output signal with a first level is produced at the junction of the first and second transistors. When the delayed clock signal reaches a second level, the switching circuit connects the gate of the first transistor to the junction of the first and second transistors and the bootstrap capacitor boosts the output signal to a second level.

Other references in the general field of voltage or level boosting include the following U.S. patents.

U.S. Pat. No. 3,999,081 by T. Nakajima entitled CLOCK-CONTROLLED GATE CIRCUIT issued Dec. 21, 1976.

U.S. Pat. No. 3,982,138 by Luisi et al entitled HIGH SPEED-LOW COST, CLOCK CONTROLLED CMOS LOGIC IMPLEMENTATION issued Sept. 21, 1976.

U.S. Pat. No. 3,947,829 by Y. Suzuki entitled LOGICAL CIRCUIT APPARATUS issued Mar. 30, 1976.

U.S. Pat. No. 3,943,377 by Y. Suzuki entitled LOGICAL CIRCUIT ARRANGEMENT EMPLOYING INSULATED GATE FIELD EFFECT TRANSISTORS issued Mar. 9, 1976.

U.S. Pat. No. 3,852,625 by M. Kubo entitled SEMICONDUCTOR CIRCUIT issued Dec. 3, 1974.

U.S. Pat. 3,801,831 by J. S. Dame entitled VOLTAGE LEVEL SHIFTING CIRCUIT issued Apr. 2, 1974.

U.S. Pat. 4,129,794 entitled ELECTRICAL INTEGRATED CIRCUIT CHIPS issued Dec. 12, 1978.

U.S. Pat. No. 4,398,100 entitled BOOSTER CIRCUIT issued Aug. 9, 1983.

U.S. Pat. No. 4,639,622 entitled BOOSTING WORD-LINE CLOCK CIRCUIT FOR SEMICONDUCTOR MEMORY issued Jan. 27, 1987.

U.S. Pat. No. 4,707,625 entitled SEMICONDUCTOR INTEGRATED CIRCUIT DEVICE FORMED WITH A CMOS CIRCUIT AND A BOOTSTRAP CAPACITOR issued Nov. 17, 1987.

SUMMARY OF THE INVENTION

A object of the present invention is to provide a semiconductor memory clock circuit for boosting the wordline voltage.

DESCRIPTION OF PREFERRED EMBODIMENTS

This disclosure describes two new wordline boost clocks that can be used in MOS DRAMs. These new circuits require only one boost capacitor and discharge the wordlines faster, improving the DRAM access time.

Figure 1:
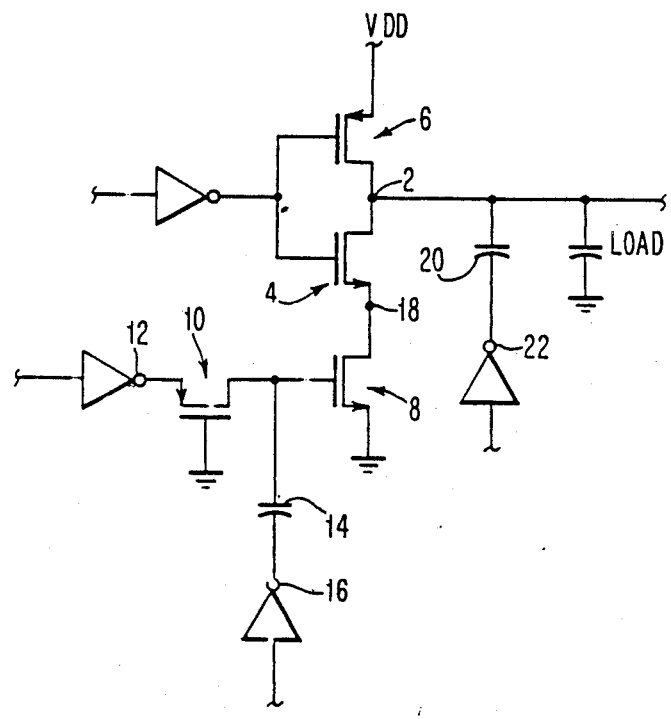
FIG. 1 is a schematic illustration of a boost circuit according to the prior art.
Figure 2:
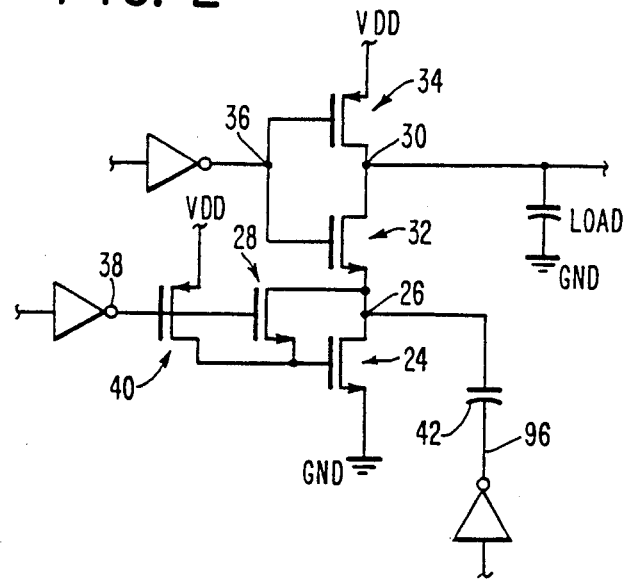
FIG. 2 is a schematic illustration of one embodiment of a boost circuit according to the present invention.
Figure 3:
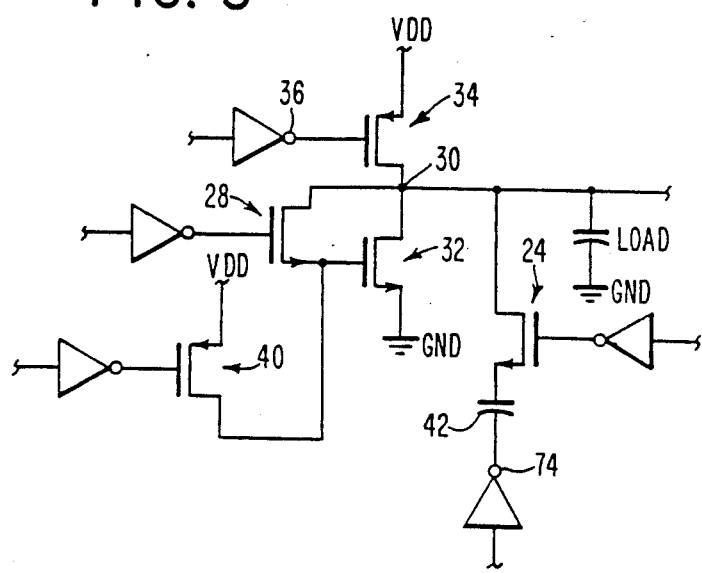
FIG. 3 is a schematic illustration of another embodiment of a boost circuit according to the present invention.

In conventional CMOS DRAM designs, the wordlines are frequently boosted above the VDD power supply level for an n-array or below VDD for a p-array to restore the full signal to the cells. In the proposed present invention, a high speed CMOS DRAM is disclosed wherein a p-array is used with a negative substrate bias. The wordlines are boosted below GND (ground potential) at least by the magnitude of the threshold voltage of the array transfer device to restore the full signal to the cells. The negative substrate bias makes nmos devices handle negative voltages during the boosting phase of the wordline clock. In this disclosure, two embodiments of boost wordline clock circuits are described which demonstrate significant advantages over the prior art circuits. One basic difference between the new circuits of the present invention and the prior art, for example the design described in U.S. Pat. No. 4,678,941, is in the methods of floating the gate of the nmos device which drives the load to negative during the boosting. FIGS. 1, 2 and 3 explain the difference in the basic concepts with simplified schematic diagrams of the designs. In FIG. 1, the prior art design, the load (wordlines, node 2) is discharged to ground through devices 4 and 8 with device 6 off. After the load is sufficiently discharged, the gate of device 8 is pulled down to $|V_{TP}|$ of device 10 as node 12 goes to ground. Then the boost capacitor 14 further pulls down the gate to negative when node 16 goes to ground. With the gate of device 8 off, the node 18 is isolated from the rest of the circuit except device 4 and it floats. The boost capacitor 20 pulls the load to negative as node 22 goes to ground. In FIGS. 2 and 3, simplified embodiments of the circuits of the present invention are shown. In FIG. 2, the gate of device 24 is connected to the node 26 through device 28. The node 30 (wordline load) is discharged through device 32 and device 24 when node 36 is high with node 38 low. After a sufficient discharge of node 30, node 38 is pulled to VDD turning device 28 on and device 40 off. The NMOS transistor 24 has its gate and drain connected together and forms a diode. When the boost capacitor 42 pulls the node 26 down to negative, device 24 stays completely off because of its diode configuration and node 30 is pulled to negative through device 32. In FIG. 3, device 24 is connected between the boost capacitor 42 and the node 30. The wordline load at node 30 is discharged through device 32 with device 40 on but device 28 and device 24 off. After a sufficient discharge of the load, device 40 is turned off but device 28 is turned on, making device 32 a diode. When node 74 is pulled to ground, the node 30 is pulled down to negative with device 24 on. Unlike the circuits of FIG. 1 and FIG. 2, in FIG. 3, the load discharges through only one nmos device and consequently discharges faster than the other two circuits.

Figure 4:
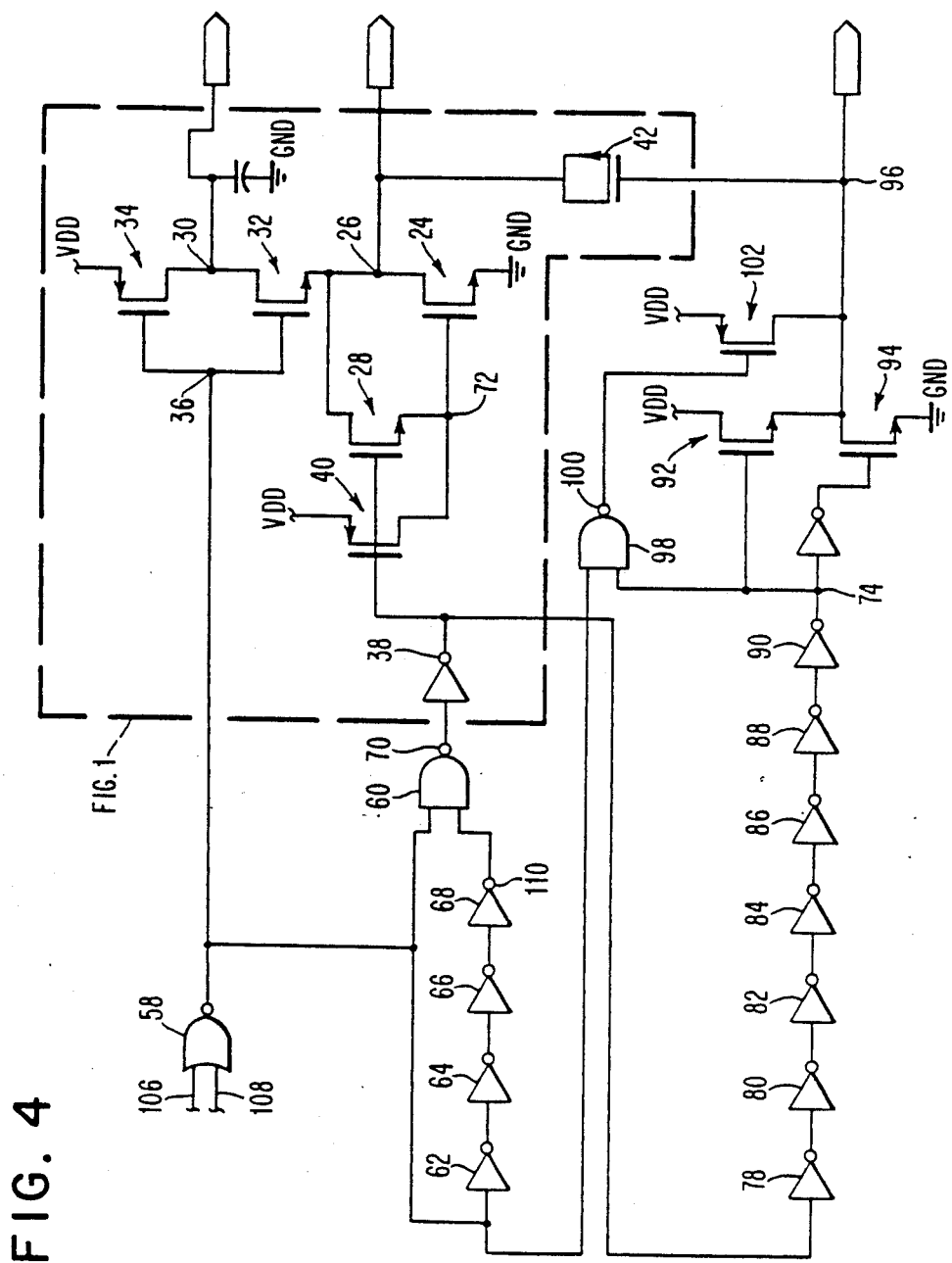
FIG. 4 is a schematic illustration of the boost circuit of FIG. 2 incorporated into a CMOS DRAM system.
Figure 5:
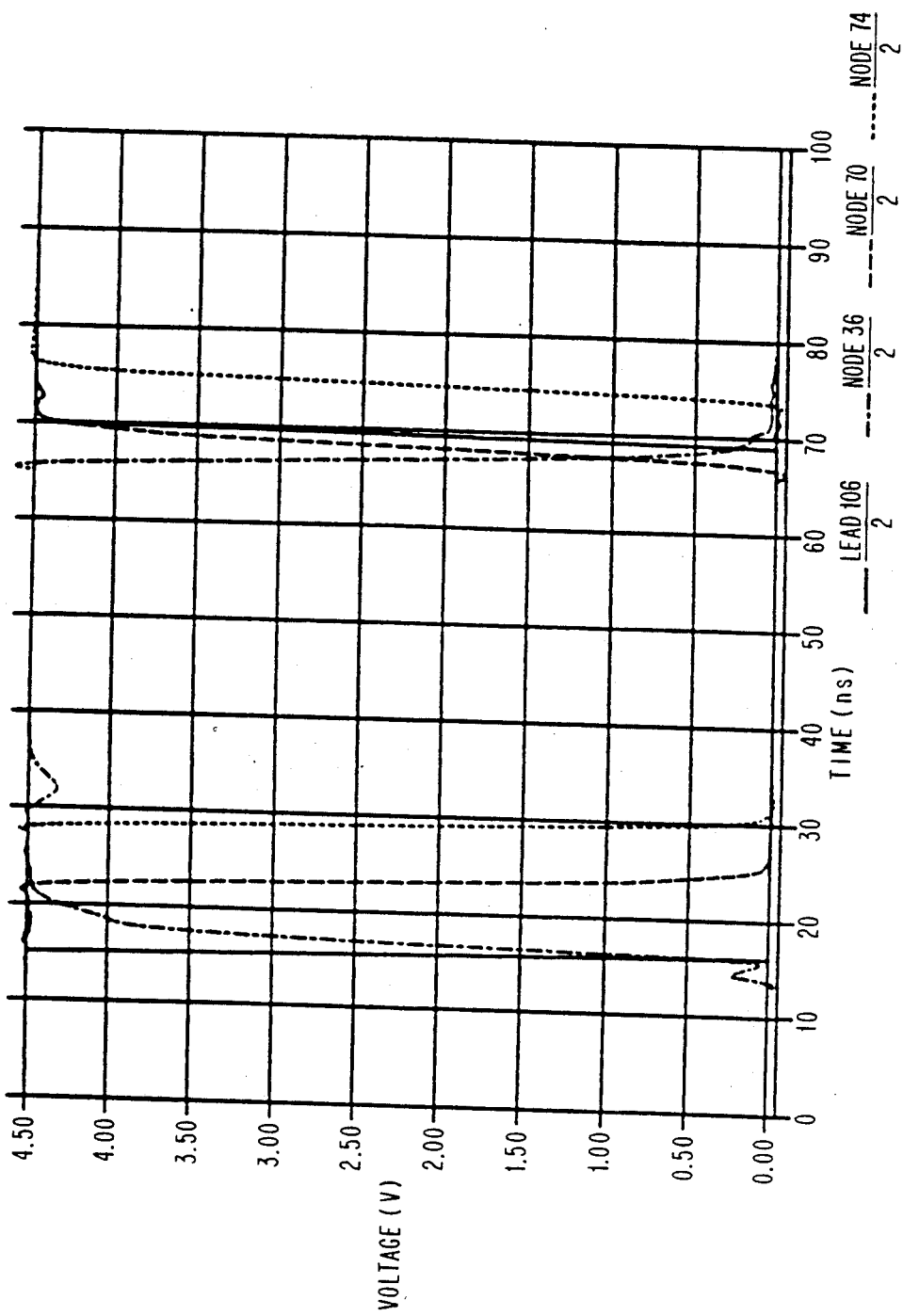
FIGS. 5, 6 and 7 are curves illustrating the operation of the system of FIG. 4.
Figure 6:
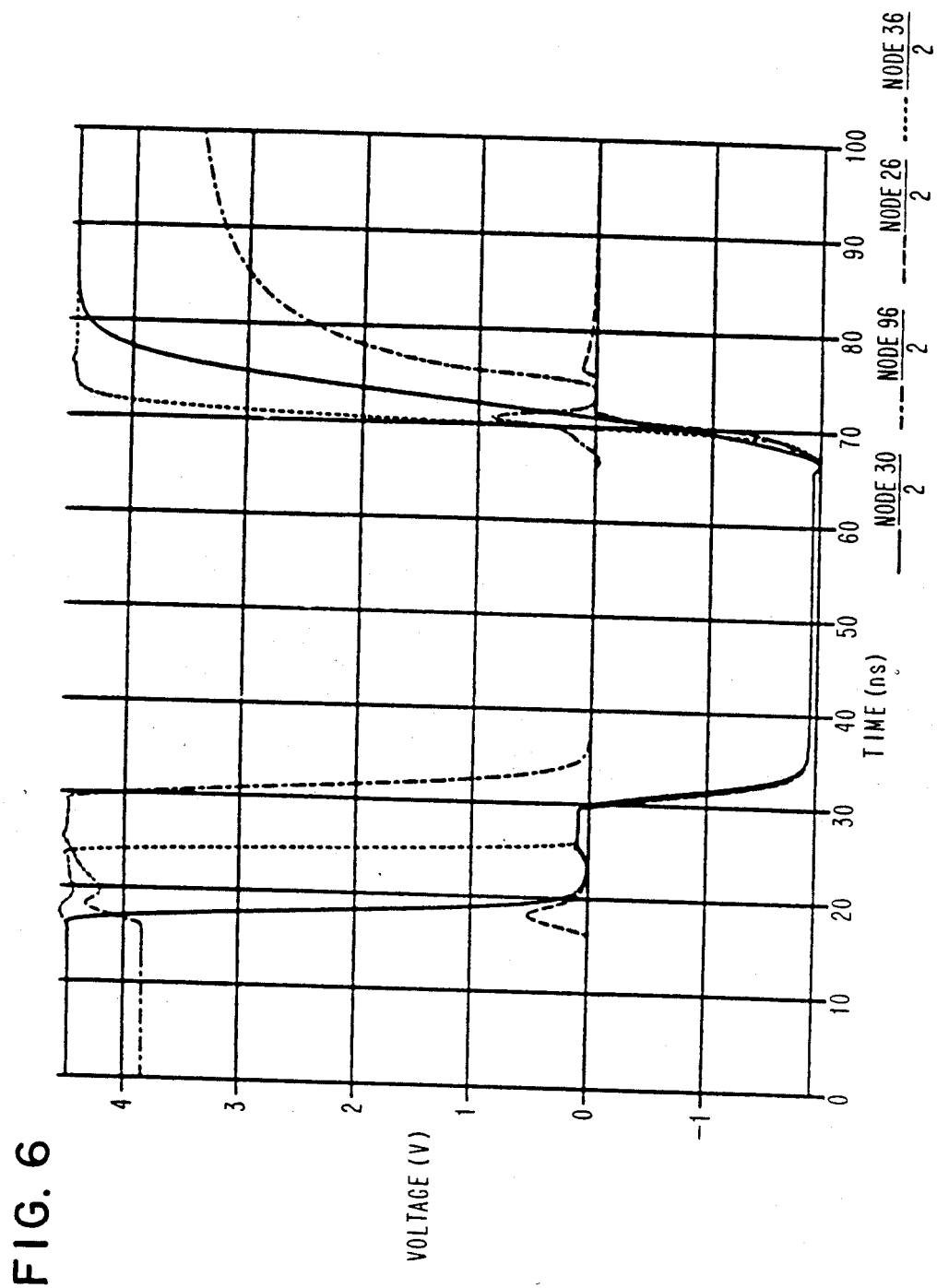
Figure 7:
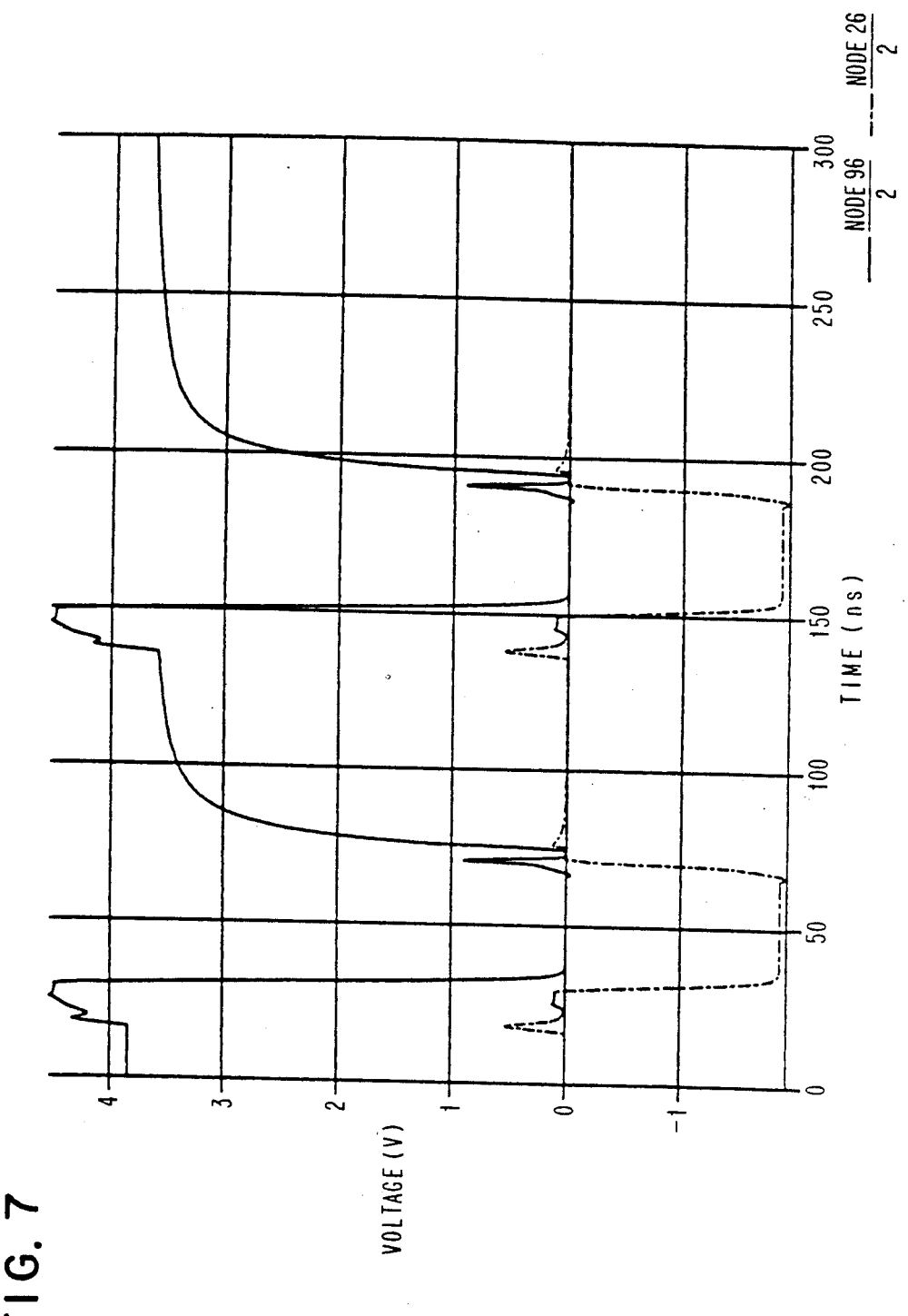

FIG. 4 shows the circuit of FIG. 2 incorporated into a boost clock system, while FIGS. 5, 6 and 7 show the waveforms of the various nodes. A capacitive load is connected to node 30. The circuit operates as follows.

During standby: Initially, timing signals on leads 106 and 108 connected to the input of nor gate 58 are high and the output of nor gate 58 connected to node 36 is low. Device 34 and device 32 whose gates are connected to node 36 are on and off, respectively and the load is maintained at VDD. Node 36 is connected to the nand gate 60 in two ways, i.e., directly and after going through the inverter chain composed of inverters 62, 64, 66 and 68. The output node 70 of gate 60 is high and node 38 is low. Device 40 is on and device 28 is off and the node 72 is at VDD with device 24 on. Node 26 is at GND but device 32 is off, preventing the load from discharging to the ground. Node 74 is high and has the opposite polarity of node 38 because of the delay chain composed of inverters 78, 80, 82, 84, 86, 88 and 90. The nmos transistor 92 is on with device 94 off, keeping the node 96 at $VDD - V_{TN}$. The nand gate 98 has nodes 36 and 74 as input and its output node 100 is high, keeping device 102 off. The boost capacitor 42, which is connected between nodes 96 and 26, is an inversion capacitor. It has a voltage drop of $VDD - V_{TN}$ across its gate and source/drain and is fully on with the maximum capacitance.

During discharging and boosting: When the timing signals on leads 106 and 108 fall to GND, the node 36 goes high, turning device 32 on while turning device 34 off. The nand gate 60 output node 70 stays high until node 110 goes high after the time delay determined by the inverters 62 through 68. This keeps node 72 high, discharging the load to ground through devices 32 and 24. The time delay determines the discharging time of the load and is easily changed by adding an even number of inverters between inverter 68 and gate 60. The high state at node 36 will immediately make node 100 go low, turning device 102 on slowly because of the relatively small W/L ratio of gate 98 compared to the size of device 102. This will pull the node 96 up from VDD−$V_{TN}$ to VDD slowly. The discharging of the load through device 32 and device 24 causes the node 26 to bump up. This in turn bumps the node 96 up because of the capacitive coupling through capacitor 42. However, the bump is smaller than $V_{TN}$ and, the node 96 stays below VDD. If the node 96 were precharged to VDD instead of VDD−$V_{TN}$, the bump would have caused the node 96 to overshoot too high above VDD. After the bump in node 26 disappears, the node 96 is fully charged to VDD. After the time delay determined by the inverters 62 through 68, node 70 goes low. This turns device 28 on but turns device 40 off. Device 24 is now in a diode configuration. The low state at node 70 ripples through the inverter chain 78 through 90 and forces node 74 to low. This turns on device 94 at the expense of devices 92 and 102. Node 96 is discharged through device 94 from VDD and GND and consequently, the node 26 is boosted to negative from GND through the boost capacitor 42. With device 32 on, the node 30 is boosted to the same voltage as node 26.

During resetting: Resetting is accomplished by pulling either the timing signal on lead 106 or 108 to VDD. No deleterious overshoot or undershoot is observed during resetting.

Figure 8:
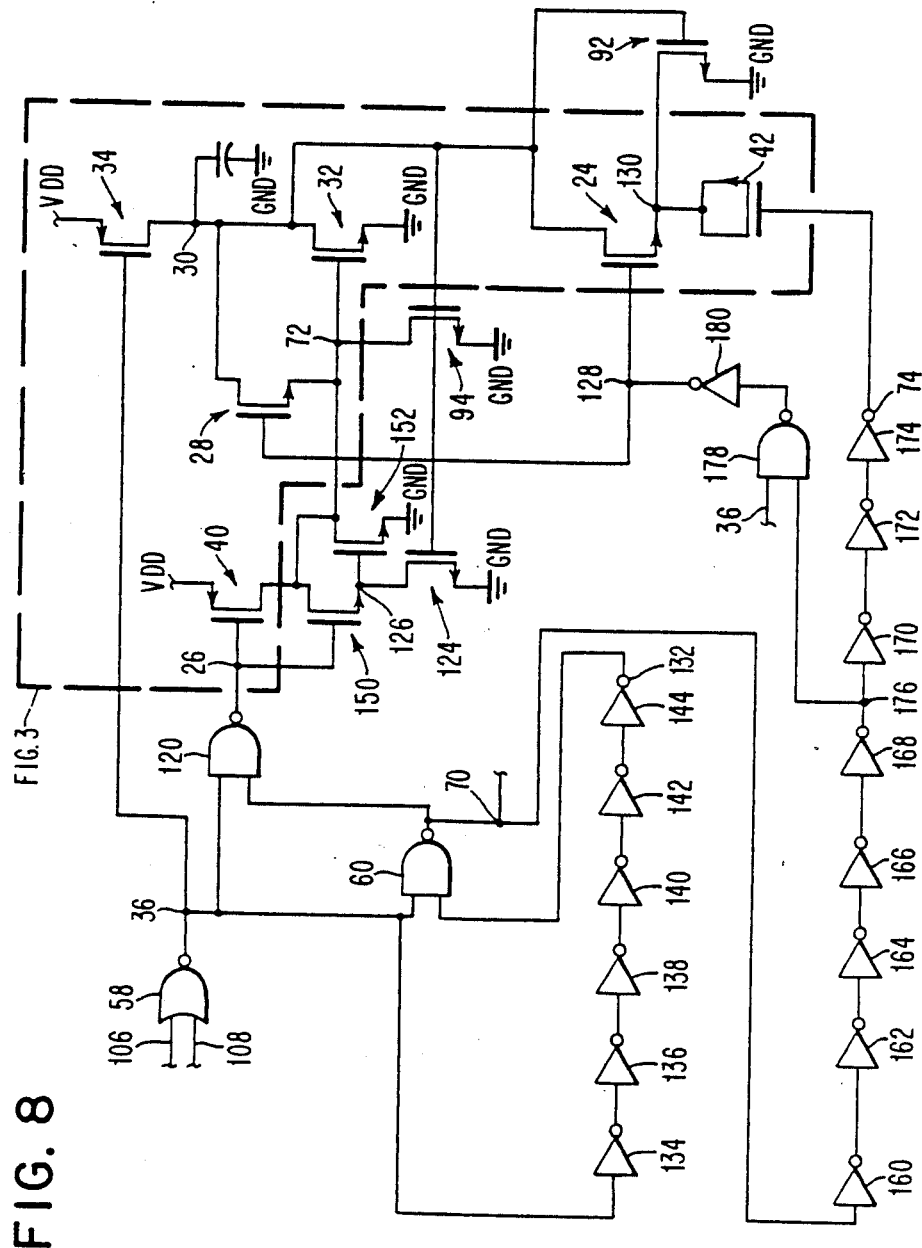
FIG. 8 is a schematic illustration of the boost circuit of FIG. 3 incorporated into a CMOS DRAM system.
Figure 9:
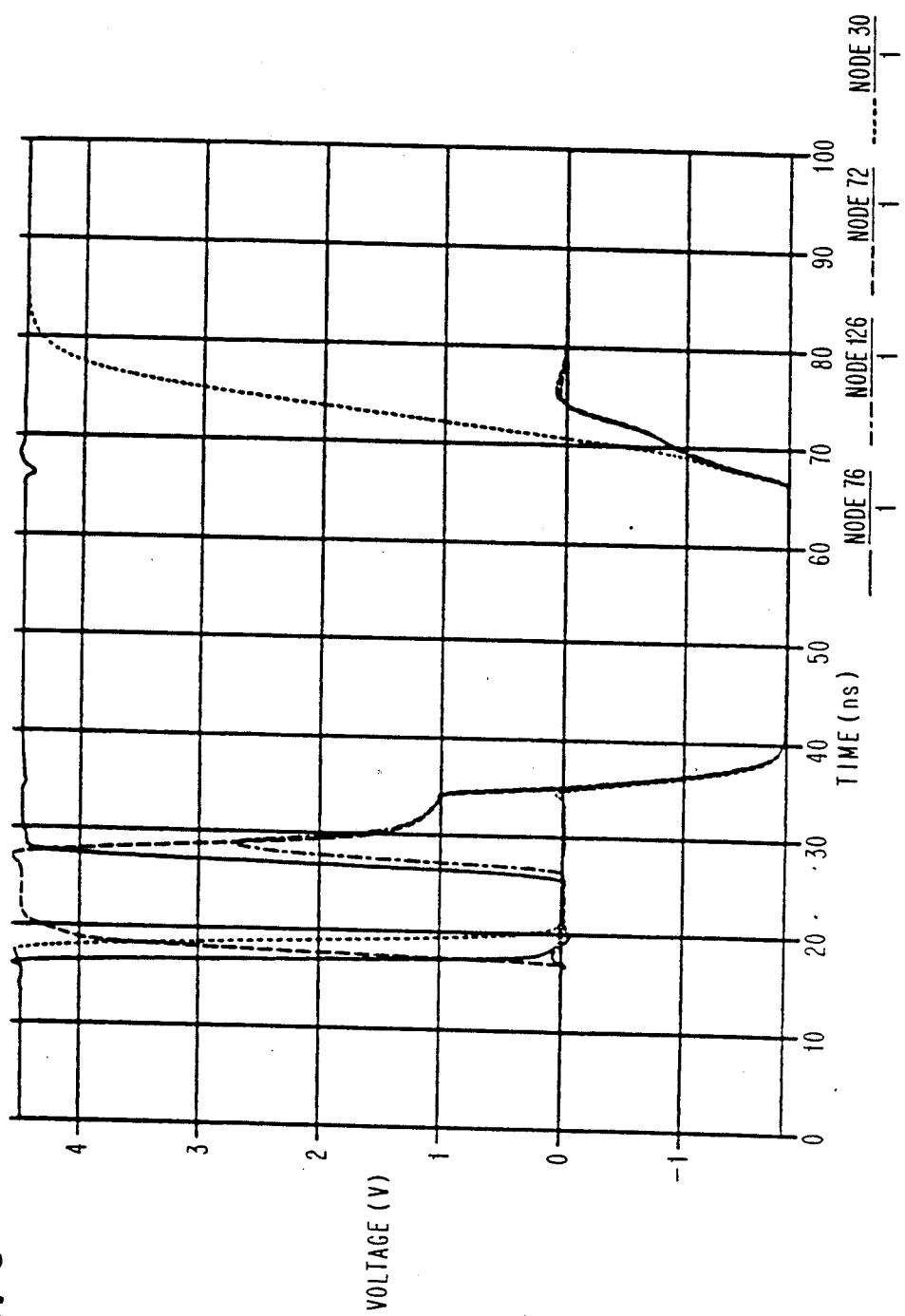
FIGS. 9, 10 and 11 are curves illustrating the operation of the system of FIG. 8.
Figure 10:
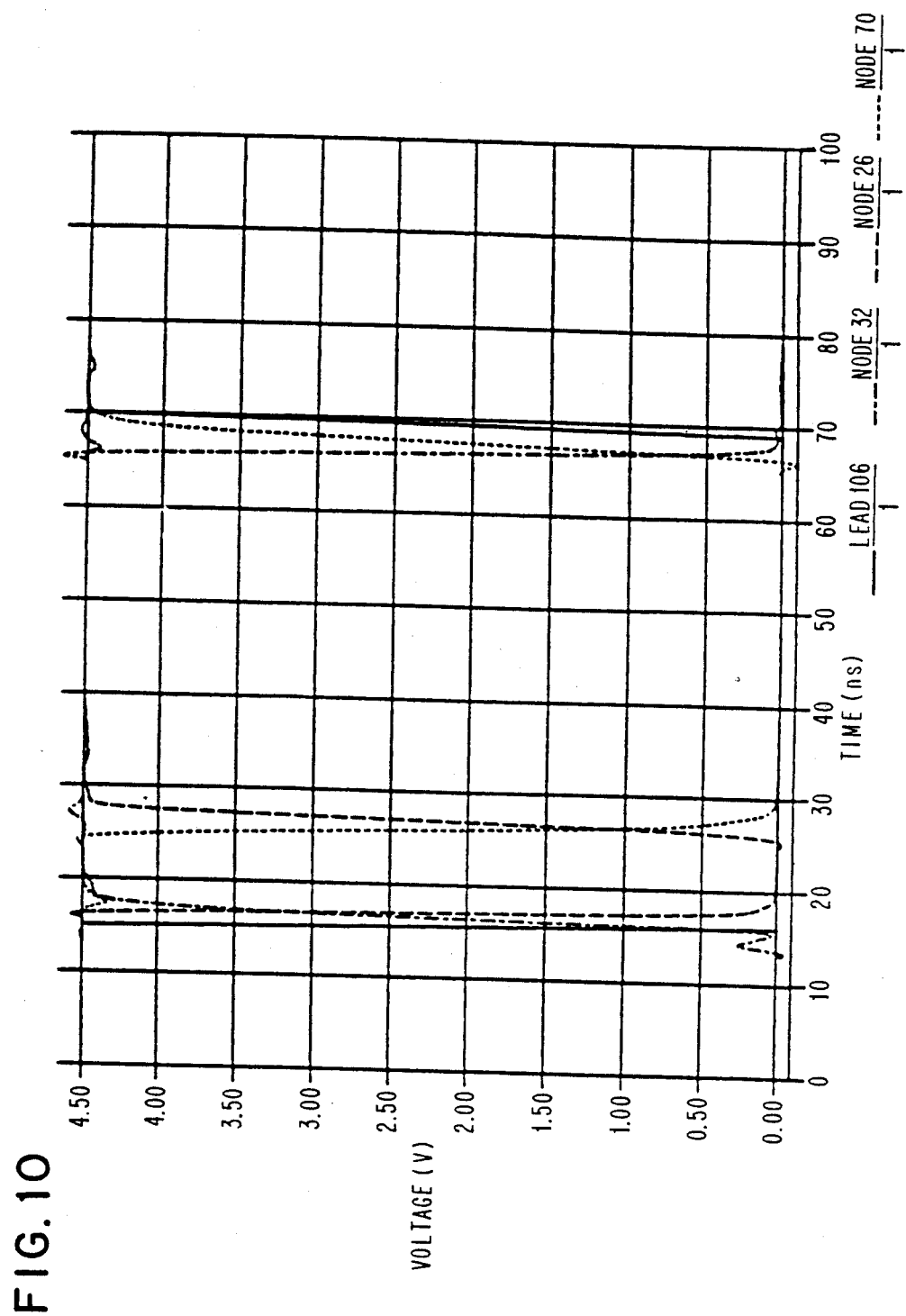
Figure 11:
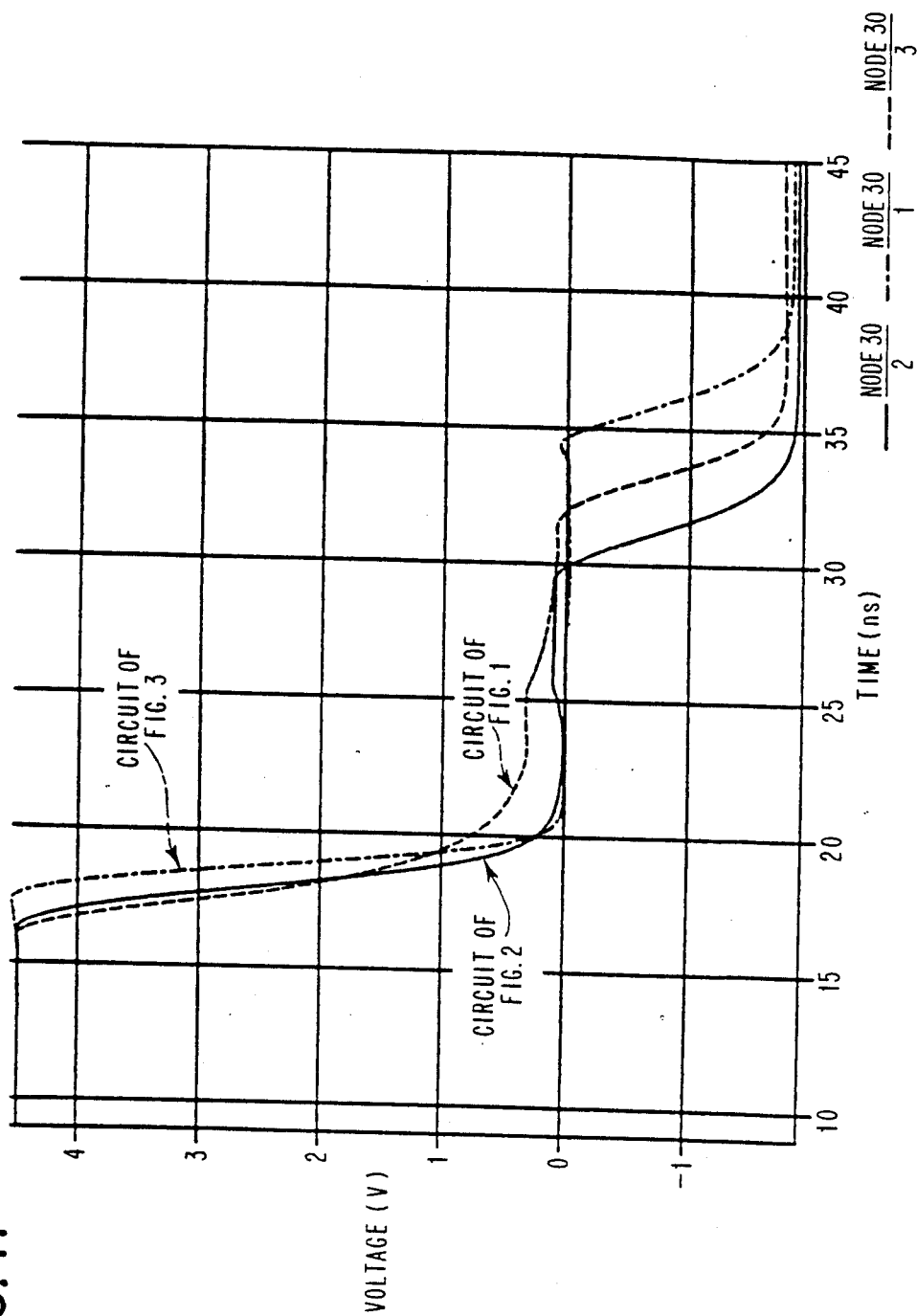

FIG. 8 shows the the circuit of FIG. 3 incorporated into the boost clock system while FIGS. 9, 10 and 11 show the waveforms of the various nodes. A capacitive load is connected to the node 30. The circuit operates as follows.

During standby: Initially, the timing signals on leads 106 and 108 are high and the output of the nor gate 58 connected to node 36 is low. This in turn makes node 26 high with device 40 off. Device 34 whose gate, is connected to node 36 is on and pulls the node 30 to VDD, which causes device 94 and device 124 to discharge nodes 72 and 126 to ground. The output node 70 of the nand gate 60 is high. This forces node 74 to be high and node 128 to be low. Consequently, devices 28 and 24 are off. The high state at node 30 forces node 130 to be low. The boost capacitor 42, which is connected between node 74 and 130, is an inversion capacitor. It has a voltage drop of VDD across its gate and source/drain and is fully on with the maximum capcitance.

During discharging and boosting: When the timing signals on leads 106 and 108 fall to GND, the node 36 goes high and turns device 34 off. The nand gate output node 70 stays high until node 132 goes high after the time delay determined by the six inverters 134, 136, 138, 140, 142 and 144. As long as node 70 stays high, node 26 is low and pulls node 72 high, turning device 32 on. The W/L of device 94 is chosen such that device 40 could pull node 72 to high with device 94 fully on. Device 32 completely discharges node 30 and also turns both devices 124 and 94 off. After the time delay determined by the inverters 134 through 144, node 70 goes low and forces node 26 to high. This shuts device 40 off but turns device 150 on. This connects the gate and drain of device 152 together, forming a diode configuration. Nodes 126 and 72 are connected together and discharge to $V_{TN}$ of device 152. The low state at node 70 ripples through the inverter chain 160, 162, 164, 166, 168, 170, 172 and 174. After a five inverter delay, node 176 connected after inverter 168 goes high which turns device 24 and device 28 on after going through nand gate 178 and inverter 180. With device 28 on, device 32 is in a diode configuration. The high state at node 176 pulls node 74 to ground after three inverter delay, which boosts node 130 to negative through the boosting capacitor 42. Since device 24 is on, node 30 is boosted to the same voltage as node 130.

During resetting: Resetting is accomplished by pulling either the timing signal on lead 106 or 108 to VDD. Node 36 becomes low and device 34 turns on, pulling node 30 high. Gate 178 has node 36 as one of its input and turns devices 28 and device 24 off by pulling node 128 to low. Without the nand gate 178, node 128 would have stayed at VDD and would have an unacceptable overshoot due to the capacitive coupling through device 24 when node 30 is pulled to VDD. No deleterious overshoot or undershoot is observed during resetting.

Having thus described our invention, what we claim as new and desire to secure by Letters Patent is:

1. A voltage boosting clock circuit for semiconductor memory array wordlines comprising:
   a boost capacitor element,
   first, second, third, fourth and fifth transistor devices, said first and fifth transistor devices being of a first conductivity type and said second, third and fourth transistor devices being of a second conductivity type,
   said first and second transistor devices having electrodes thereof connected together at a first node to a wordline of a memory array,
   said third transistor device having an electrode thereof connected to an electrode of said second transistor device and an electrode thereof connected to said boost capacitor element,
   said fourth transistor device having an electrode thereof connected to an electrode of said second transistor device,
   said fifth transistor device having an electrode thereof connected to an electrode of said fourth transistor device,
   a source of potential VDD and a source of ground potential GND,
   said first and fifth transistor devices also having electrodes thereof connected to said potential source VDD, and said first transistor device having an electrode thereof connected to a source of timing signals at a second node,
   wherein initially said timing signals at said second node are in a first level condition and said first transistor device is on and said second transistor device is off, wherein said wordline connected to said first node is at a potential VDD,
   wherein, in response to said timing signals going to a second level condition, said first transistor device turns off, said second transistor device, turns on, the voltage level of VDD of said wordline connected to said first node discharges through at least said second transistor device and said wordline at said first node becomes connected to said boost capacitor through said second transistor device and the voltage level at said wordline therefore becomes more negative than said ground potential GND.

2. A voltage boosting clock circuit according to claim 1 wherein said first transistor device includes a source, a drain and a gate electrode,
said second transistor device includes a source, a drain and a gate electrode,
said third transistor device includes a source, a drain and a gate electrode,
said fourth transistor device includes a source, a drain and a gate electrode, and
said fifth transistor device includes a source, a drain and a gate electrode and wherein
said source electrode of said second transistor device is connected to said drain electrode of said third transistor device at a third node,
said drain electrode of said second transistor device is connected to said drain electrode of said first transistor device and to said wordline at said first node,
said drain electrode of said fourth transistor device is connected to said third node,
said source electrode of said fourth transistor device is connected to said gate electrode of said third transistor device,
said drain electrode of said fifth transistor device is connected to said gate electrode of said third transistor device,
said source electrode of said fifth transistor device and said source electrode of said first transistor device is connected to said source of potential VDD,
said source electrode of said third transistor device is connected to said source of ground potential GND,
and said gate electrode of said first and second transistor devices are connected to said source of timing signals at said second node,
wherein in response to said timing signals level change, said voltage level VDD of said wordline at said first node discharges through said second and third transistor devices to said ground potential GND and said boost capacitor is connected to said first node through said second transistor device and the level of said wordline at said first node becomes more negative than said ground potential GND.

3. A voltage boosting clock circuit according to claim 1 wherein said first transistor device includes a source, a drain and a gate electrode,
said second transistor device includes a source, a drain and a gate electrode,
said third transistor device includes a source, a drain and a gate electrode,
said fourth transistor device includes a source, a drain and a gate electrode, and
said fifth transistor device includes a source, a drain and a gate electrode and wherein
said drain electrode of said second transistor device is connected to said drain electrode of said first transistor device at said first node,
said drain electrode of said third transistor device and said drain electrode of said fourth transistor device are connected to said first node,
said source electrode of said third transistor device is connected to said boost capacitor element,
said source electrode of said fourth transistor device is connected to said gate element of said second transistor device,
said drain electrode of said fifth transistor device is connected to said source electrode of said fourth transistor device and to said gate electrode of said second transistor device,
said source elements of said first transistor and said fifth transistor devices are connected to said source of potential VDD,
said source electrode of said second transistor device is connected to said source of ground potential GND,
and said gate electrode of said first and fifth transistor devices are connected to said source of timing signals,
wherein in response to said timing signal level change, said voltage level VDD of said wordline at said first node discharges through said second transistor device to said ground potential VDD and said boost capacitor is connected to said first node through said third transistor device and the level of said wordline at said first node becomes more negative than said ground potential GND.

4. A voltage boosting clock circuit according to claim 2 wherein, in response to said level change of said timing signals at said second node connected to said gate electrode of said second transistor device, said voltage on said wordline at said first node is discharged through said second and third transistor devices to said ground potential GND connected to said source electrode of said third transistor device,
and wherein, after said voltage on said wordline at said first node is discharged, said negative voltage from said boost capacitor is applied to said wordline at said first node through said second transistor device.

5. A voltage boosting clock circuit according to claim 4 further including a first logic gate having an output terminal connected to said gate electrode of said fifth transistor device and having a first input terminal connected to said source of timing signals at said second node,
a first inverter circuit having an input terminal connected to said source of timing signals at said second node and an output terminal connected to a second input terminal of said first logic gate,
a second logic gate having a first input terminal connected to said source of timing signals at said second node,
a second inverter circuit having an input terminal connected to the said output terminal of said first logic gate, having a first output terminal connected to a second input terminal of said second logic gate, and having a second output terminal connected to said boost capacitor element.

6. A voltage boosting clock circuit according to claim 4 wherein said timing signals at said second node are at said first level condition, said first transistor device having its gate connected to said second node is initially on, placing said wordline connected to said first node at VDD and said second transistor device is initially off, placing said third node at GND, said fifth transistor device is initially on and said fourth transistor device is initially off, said third transistor device is on, having its gate electrode connected to VDD through said on fourth transistor device,
and wherein, in response to said timing signals at said second node going to said second level condition, said first transistor device turns off, said second transistor device goes on, said timing signal second level condition on said second node is inverted by said first inverter means and maintains said fifth transistor device on, whereby said third transistor device stays on and the potential VDD on said wordline and said first node is discharged through said second and third transistor devices to GND potential.

7. A voltage boosting circuit according to claim 6 further including a sixth, seventh and eighth transistor,
said sixth transistor having a gate electrode connected to the output of said second logic gate, a drain electrode connected to said boost capacitor means and a source electrode connected to said potential source VDD,
said seventh transistor device having a gate electrode connected to said second output terminal of said second inverter means, a drain electrode connected to said drain of said sixth transistor device and a source electrode connected to said GND potential,
said eight transistor having a drain electrode connected to source VDD potential a gate electrode connected said first output terminal node of said second inverter means and to said second input terminal of said second logic gate and a drain electrode connected to said drains of said sixth and seventh transistor devices and to said boost capacitor means
wherein said sixth transistor device turns on in response to said second signal timing signals at said second node connected through said third logic gate, wherein said seventh transistor turning on in response to said output from said second inverter means hereby discharging said boost capacitor means to said GND potential, whereby said third node and said first node connected to said wordline to be at a negative potential.

8. A voltage boosting clock circuit according to claim 3 wherein, in response to said level change of said timing signals at said second node connected to said gate electrode of said second transistor device, said voltage on said wordline at said first node is discharged through said second transistor device to said ground potential GND connected to said source electrode of said second transistor device,
and wherein, after said voltage on said wordline at said first node is discharged, said negative voltage from said boost capacitor is applied to said wordline at said first node through said third transistor device.

9. A voltage boosting clock circuit according to claim 8 further including a first logic gate having an output terminal connected to said gate electrode of said fifth transistor device and having a first input terminal connected to said source of timing signals at said second node,
a second logic gate having an output terminal connected to a second input terminal of said first logic gate and a first input terminal connected to said source of timing signals at said second node,
a first inverter circuit having an input terminal connected to said source of timing signals at said second node and an output terminal connected to a second input terminal of said second logic gate,
a third logic gate having an output connected to said gate electrode of said third transistor device and having a first input terminal connected to said timing signals at said second node
a second inverter circuit having an input terminal connected to the said output terminal of said second logic gate, having a first output terminal connected to a second input terminal of said third logic gate, and having a second output terminal connected to said boost capacitor element.

10. A voltage boosting clock circuit according to claim 9 wherein said timing signals at said second node are at said first level condition, said first transistor device having its gate connected to said second node is initially on, placing said wordline connected to said first node at VDD and said third transistor device and said fourth transistor device are initially off, said fifth transistor device is initially off and said fourth transistor device is initially off and said fifth transistor device is on,
and wherein, in response to said timing signals at said second node going to said second level condition, said first transistor device turns off, said second transistor device goes on and discharges said first node and said wordline, said timing signal second level condition on said second node in inverted by said first inverter means and turns said fifth transistor device off, whereby said fourth transistor device goes on and the potential on said wordline and said first node goes to a negative potential through said second transistor device.

11. A voltage boosting circuit according to claims 1, 2 or 3 wherein said first and fifth transistor devices are PMOS devices and said second, third and fourth transistor devices are NMOS devices.

* * * * *